(12) United States Patent
Rock et al.

(10) Patent No.: US 11,892,476 B2
(45) Date of Patent: Feb. 6, 2024

(54) CURRENT SENSOR PACKAGE

(71) Applicant: Allegro MicroSystems, LLC, Manchester, NH (US)

(72) Inventors: Simon E. Rock, Heidelberg (DE); Thomas Kerdraon, Lenzkirch (DE); Yannick Vuillermet, Chavanod (FR); Loïc André Messier, Vanzy (FR); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/651,080

(22) Filed: Feb. 15, 2022

(65) Prior Publication Data

US 2023/0258693 A1    Aug. 17, 2023

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC ............................ G01R 19/0092; G01R 15/202
See application file for complete search history.

(56) References Cited

U.S. PATENT DOCUMENTS

| | | | |
|---|---|---|---|
| 4,757,420 A | 7/1988 | Saletta et al. | |
| 5,041,780 A * | 8/1991 | Rippel | G01R 15/207 324/251 |
| 6,300,617 B1 | 10/2001 | Daughton et al. | |
| 6,356,068 B1 | 3/2002 | Steiner et al. | |
| 6,512,359 B1 | 1/2003 | Tamai et al. | |
| 6,583,613 B1 | 6/2003 | Hohe et al. | |

(Continued)

FOREIGN PATENT DOCUMENTS

| | | |
|---|---|---|
| CN | 112649645 A | 4/2021 |
| GB | 2547732 14 | 8/2017 |
| WO | WO 2017/144715 A1 | 8/2017 |

OTHER PUBLICATIONS

U.S. Office Action dated Sep. 14, 2022 for U.S. Appl. No. 17/467,713; 19 pages.

(Continued)

*Primary Examiner* — Dominic E Hawkins
(74) *Attorney, Agent, or Firm* — Daly, Crowley, Mofford & Durkee, LLP

(57) ABSTRACT

Current sensor packages are described including a leadframe configured to carry a current to be sensed and a current sensor that is electrically isolated from the leadframe. The current sensor is disposed adjacent to a first portion of the leadframe that includes a plurality of notches. An encapsulating material is configured to encapsulate the current sensor and at least a part of the first portion of the leadframe that is adjacent to the current sensor and includes the plurality of notches. The current sensor includes a substrate, a first magnetic field sensing element that is formed on the substrate, and a second magnetic field sensing element that is formed on the substrate. The first magnetic field sensing element and the second magnetic field sensing element are disposed on opposite sides of a central axis of the first portion of the leadframe.

23 Claims, 12 Drawing Sheets

(56) References Cited

U.S. PATENT DOCUMENTS

| | | | |
|---|---|---|---|
| 6,781,359 | B2 | 8/2004 | Stauth et al. |
| 6,995,315 | B2 | 2/2006 | Sharma et al. |
| 7,075,287 | B1 | 7/2006 | Mangtani et al. |
| 7,166,807 | B2 | 1/2007 | Gagnon et al. |
| 7,476,816 | B2 | 1/2009 | Doogue et al. |
| 7,598,601 | B2 | 10/2009 | Taylor et al. |
| 7,709,754 | B2 | 5/2010 | Doogue et al. |
| 7,746,056 | B2 | 6/2010 | Stauth et al. |
| 7,816,905 | B2 | 10/2010 | Doogue et al. |
| 7,923,996 | B2 | 4/2011 | Doogue et al. |
| 7,936,164 | B2 | 5/2011 | Doogue et al. |
| 8,030,918 | B2 | 10/2011 | Doogue et al. |
| 8,080,994 | B2 | 12/2011 | Taylor et al. |
| 8,447,556 | B2 | 5/2013 | Friedrich et al. |
| 8,542,010 | B2 | 9/2013 | Cesaretti et al. |
| 8,680,846 | B2 | 3/2014 | Cesaretti et al. |
| 8,692,546 | B2 | 4/2014 | Cesaretti et al. |
| 8,818,749 | B2 | 8/2014 | Friedrich et al. |
| 8,847,590 | B2 | 9/2014 | Flock et al. |
| 8,896,295 | B2 | 11/2014 | Friedrich et al. |
| 8,907,669 | B2 | 12/2014 | Petrie |
| 9,081,041 | B2 | 7/2015 | Friedrich et al. |
| 9,151,807 | B2 | 10/2015 | Friedrich et al. |
| 9,201,122 | B2 | 12/2015 | Cesaretti et al. |
| 10,481,181 | B2 | 11/2019 | Bussing et al. |
| 10,761,120 | B2 | 9/2020 | Feucht et al. |
| 10,884,031 | B2 | 1/2021 | Vuillermet et al. |
| 10,908,190 | B2 | 2/2021 | Bussing et al. |
| 11,047,884 | B2 | 6/2021 | Shimizu |
| 11,047,928 | B2 | 6/2021 | Vuillermet et al. |
| 11,099,217 | B2 | 8/2021 | Vuillermet et al. |
| 11,226,382 | B2 | 1/2022 | Augendre et al. |
| 11,395,402 | B2 | 7/2022 | Sutono |
| 2007/0279053 | A1 | 12/2007 | Taylor et al. |
| 2008/0231255 | A1 | 9/2008 | Lepine et al. |
| 2009/0121704 | A1 | 5/2009 | Shibara |
| 2011/0270553 | A1* | 11/2011 | Ausserlechner ....... G01N 27/72 702/183 |
| 2012/0001617 | A1 | 1/2012 | Reynolds |
| 2012/0112365 | A1* | 5/2012 | Ausserlechner ........ H01L 23/16 438/126 |
| 2012/0146164 | A1* | 6/2012 | Ausserlechner ........ H01L 43/14 257/E29.323 |
| 2012/0253726 | A1 | 10/2012 | Xu |
| 2013/0015843 | A1 | 1/2013 | Doogue et al. |
| 2013/0135548 | A1 | 5/2013 | Burberry et al. |
| 2013/0335076 | A1 | 12/2013 | Sakamoto et al. |
| 2014/0111196 | A1 | 4/2014 | Sakai et al. |
| 2014/0266181 | A1 | 9/2014 | Milano et al. |
| 2014/0312883 | A1 | 10/2014 | Friedrich et al. |
| 2015/0204916 | A1 | 7/2015 | Akimoto et al. |
| 2015/0301149 | A1 | 10/2015 | Cesaretti et al. |
| 2015/0331079 | A1 | 11/2015 | Kolwalker et al. |
| 2015/0338444 | A1 | 11/2015 | Ivanov et al. |
| 2015/0362532 | A1 | 12/2015 | Chartouni |
| 2016/0011239 | A1 | 1/2016 | Yoon et al. |
| 2016/0274060 | A1 | 9/2016 | Deneneberg et al. |
| 2016/0282388 | A1* | 9/2016 | Milano .............. G01R 19/0092 |
| 2017/0131329 | A1 | 5/2017 | Gorai et al. |
| 2017/0242058 | A1 | 8/2017 | Kawanami et al. |
| 2017/0285075 | A1 | 10/2017 | Okuyama et al. |
| 2018/0003742 | A1 | 1/2018 | Shimizu |
| 2018/0031613 | A1* | 2/2018 | Nakayama ............. G01R 19/25 |
| 2018/0180649 | A1 | 6/2018 | Paci et al. |
| 2018/0238938 | A1 | 8/2018 | Feucht et al. |
| 2018/0321283 | A1 | 11/2018 | Sei et al. |
| 2019/0187187 | A1 | 6/2019 | Umetsu et al. |
| 2019/0212372 | A1* | 7/2019 | Bilbao De Mendizabal ............... G01R 15/205 |
| 2019/0391185 | A1 | 12/2019 | El Bacha et al. |
| 2020/0011902 | A1* | 1/2020 | Shimizu ............. G01R 19/0092 |
| 2020/0057097 | A1 | 2/2020 | Vuillermet et al. |
| 2020/0057120 | A1 | 2/2020 | Belin et al. |
| 2020/0132725 | A1 | 4/2020 | Krummenacher et al. |
| 2021/0080489 | A1 | 3/2021 | Koizumi |
| 2021/0242353 | A1 | 8/2021 | Kim et al. |

OTHER PUBLICATIONS

Notice of Allowance dated Jan. 17, 2023 for U.S. Appl. No. 17/467,713; 11 pages.
Response to Office Action dated Sep. 14, 2022, filed on Nov. 1, 2022 for U.S. Appl. No. 17/467,713; 13 pages.
Infineon Datasheet, "TLE4972-AE35D5 high precision coreless current sensor for automotive applications", Dec. 21, 2021, 20 pages.
Infineon Datasheet, "TLE4972-AE35S5 high precision coreless current sensor for automotive applications", Dec. 21, 2021, 20 pages.
U.S. Appl. No. 17/467,713, filed Sep. 7, 2021, Vuillermet, et al.
U.S. Appl. No. 17/083,487, filed Oct. 29, 2021, Briano, et al.
U.S. Appl. No. 17/189,480, filed Mar. 2, 2021, Friedrich, et al.
U.S. Appl. No. 17/695,193, filed Mar. 15, 2022, Messier, et al.
Allegro MicroSystems datasheet "ACS37612 Coreless, High Precision, Hall-Effect Current Sensor IC with Common-Mode Field Rejection and High Bandwidth (240 KHz)", Mar. 9, 2020, 22 pages.
Allegro MicroSystems Datasheet "Busbar Geometry And Design Techniques For Coreless Acs37610 Differential Current Sensor", Jan. 6, 2021, 11 pages.
Auto Innovations "L'évolution du moteur électrique passe par une meilleure mesure de la position de son rotor", Oct. 2019, 7 pages.
Melexis Inspired Engineering; "Current Sensors Reference Design Guide"; Aug. 2016; 27 Pages.
Extended European Search Report dated Jul. 10, 2018 for EP Application No. 18154879.3; 10 Pages.
Response filed on Feb. 22, 2019 for European Application No. 18154879.3; 20 Pages.
Intention to Grant dated Jun. 7, 2019 for European Application No. 18154879.3; 7 Pages.
Office Action dated Sep. 24, 2019 for U.S. Appl. No. 15/435,725; 25 pages.
Response to Office Action filed on Oct. 18, 2019 for U.S. Appl. No. 15/435,725; 13 pages.
Final Office Action dated Jan. 24, 2020 for U.S. Appl. No. 15/435,725; 25 pages.
Response to Final Office Action and Request for Continued Examination (Rce) filed on Mar. 31, 2020 for U.S. Appl. No. 15/435,725; 14 pages.
Notice of Allowance dated Jun. 9, 2020 for U.S. Appl. No. 15/435,725; 8 pages.
Office Action dated Jul. 6, 2020 for U.S. Appl. No. 15/999,122; 18 pages.
Office Action dated May 11, 2021 for U.S. Appl. No. 16/841,853, 18 pages.
Response to Office Action filed on Jul. 28, 2021 for U.S. Appl. No. 16/841,853, 12 pages.
Notice of Allowance dated Oct. 28, 2021 for U.S. Appl. No. 16/841,853, 9 pages.
Office Action dated Jul. 5, 2023 for U.S. Appl. No. 17/804,654; 16 pages.
U.S. Appl. No. 17/804,654, filed May 31, 2022, Messier, et al.
U.S. Appl. No. 18/300,776, filed Apr. 14, 2023, Vuillermet, et al.
PCT Search Report and Written Opinion dated Oct. 31, 2022 for PCT Application No. PCT/US2022/038329; 12 pages.

* cited by examiner

CURRENT SENSOR PACKAGE

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current through a proximate current conductor, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, an apparatus is provided, comprising: a leadframe configured to carry a current to be sensed; a current sensor that is electrically isolated from the leadframe, the current sensor being disposed adjacent to a first portion of the leadframe, the first portion including a plurality of notches that are formed therein, the current sensor including a substrate, a first magnetic field sensing element that is formed on the substrate, and a second magnetic field sensing element that is formed on the substrate, the first magnetic field sensing element and the second magnetic field sensing element being disposed on opposite sides of a central axis of the first portion of the leadframe and configured to sense the current; and an encapsulating material that is configured to encapsulate the current sensor and at least a part of the first portion of the leadframe that is adjacent to the current sensor and includes the plurality of notches.

According to aspects of the disclosure, an apparatus is provided, comprising: a leadframe having a first portion, a second portion, and a third portion, the first portion of the leadframe being contiguous with respect to the second portion of the leadframe and the third portion of the leadframe and being disposed between the second portion of the leadframe and the third portion of the leadframe and configured to carry a current between the second portion and the third portion, the first portion of the leadframe being disposed at a non-zero angle relative to at least one of the second portion of the leadframe and the third portion of the leadframe; a current sensor that is electrically isolated from the leadframe, the current sensor being disposed above or below the first portion of the leadframe; and an encapsulating material that is configured to encapsulate the current sensor and at least a part of the first portion of the leadframe that is situated directly above or below the current sensor.

According to aspects of the disclosure, an apparatus is provided comprising: a leadframe having a first portion, a second portion, and a third portion, the first portion of the leadframe being disposed between the second portion of the leadframe and the third portion of the leadframe, the first portion including a through-hole that is formed therein; a current sensor that is electrically isolated from the leadframe; and an encapsulating material that is configured to encapsulate the current sensor and at least a part of the first portion of the leadframe that includes the through-hole.

According to aspects of the disclosure, a method is provided, comprising: providing a leadframe having a first portion, a second portion, and a third portion, the first portion of the leadframe being contiguous with respect to the second portion of the leadframe and the third portion of the leadframe and being disposed between the second portion of the leadframe and the third portion of the leadframe and configured to carry a current between the second portion and the third portion, the first portion of the leadframe being disposed at a non-zero angle relative to at least one of the second portion of the leadframe and the third portion of the leadframe; providing a current sensor that is electrically isolated from the leadframe, the current sensor being disposed above or below the first portion of the leadframe; and encapsulating the current sensor and at least a part of the first portion of the leadframe that is situated directly above or below the current sensor in encapsulating material.

BRIEF DESCRIPTION OF THE DRAWINGS

The foregoing features may be more fully understood from the following description of the drawings in which.

DETAILED DESCRIPTION

Figure 1:
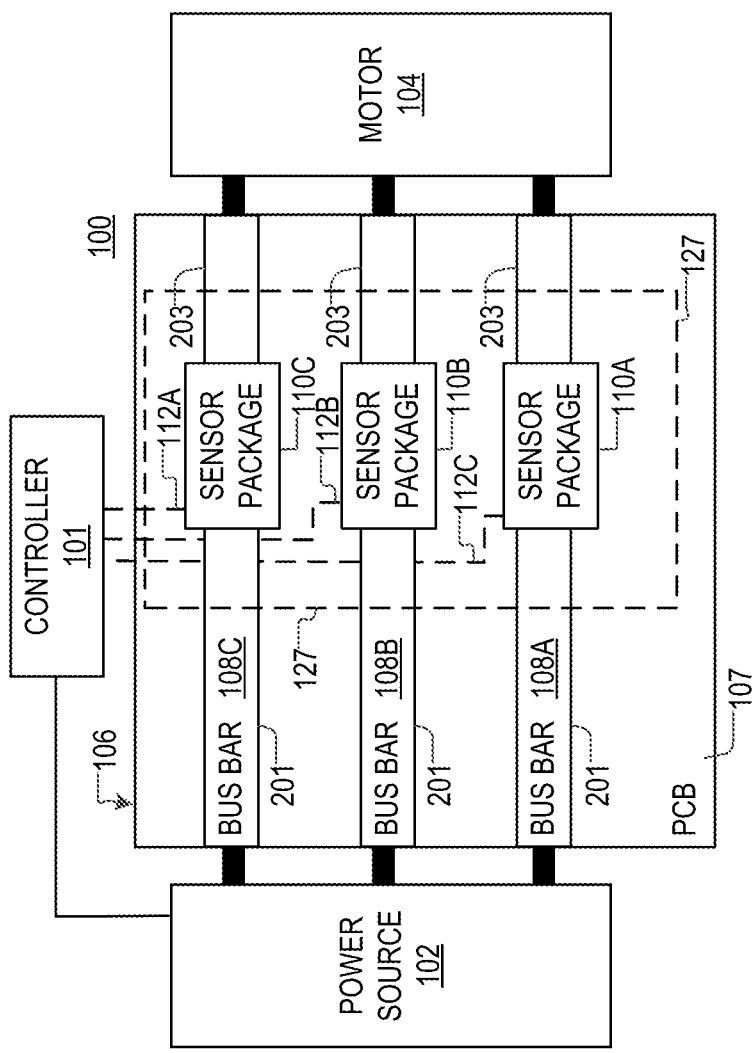
FIG. 1 is a diagram of an example of a system, according to aspects of the disclosure.

FIG. 1 is a diagram of an example of a system 100, according to aspects of the disclosure. As illustrated, the system 100 may include a controller 101 and a power source 102 that is coupled to an electric motor 104 via an interface 106. The interface 106 may include a printed circuit board (PCB) 107. The PCB 107 may include bus bars 108A-C and conductive traces 112A-C formed therein. Each of the conductive traces 112A-C may include one or more metal layers (or layers of another conductive material). Each of the bus bars 108A-C may also include one or more metal layers (or layers of another conductive material). In some implementations, the conductive traces 112A-C may differ in one or more characteristics from the bus bars 108A-C. According to the example of FIG. 1, each of the bus bars 108A-C may be configured to carry higher currents than any of the conductive traces 112A-C. Additionally or alternatively, in some implementations, each of the bus bars 108A-C may have a larger cross-section than any of the conductive traces 112A-C. Additionally or alternatively, in some implementations, each of the bus bars 108A-C may have a larger width than any of the conductive traces 112A-C.

Each of the bus bars 108A-C may be used to deliver, to the motor 104, current that is supplied by the power source 102. The controller 101 may be coupled to the sensor packages 110A-C via the conductive traces 112A-C. The controller 101 may use the sensor packages 110A-C to measure the level of electrical current through the bus bars 108A-C and make adjustments to the operation of the power source 102 in response to the measurements. The controller 101 may use the sensor package 110A to measure the current through bus bar 108A. The controller 101 may use the sensor package 110B to measure electrical current through bus bar 108B. The controller 101 may use the sensor package 110C to measure electrical current through bus bar 108C. Although in the example of FIG. 1 the interface 106 includes three bus bars, alternative implementations are possible in which the interface 106 includes any number of bus bars (e.g., only one bus bar, only two bus bars, five bus bars, etc.). Although in the example of FIG. 1 the interface 106 is used to electrically couple a motor to a power source, it will be understood that the present disclosure is not limited to any specific application of the interface 106.

Figure 2:
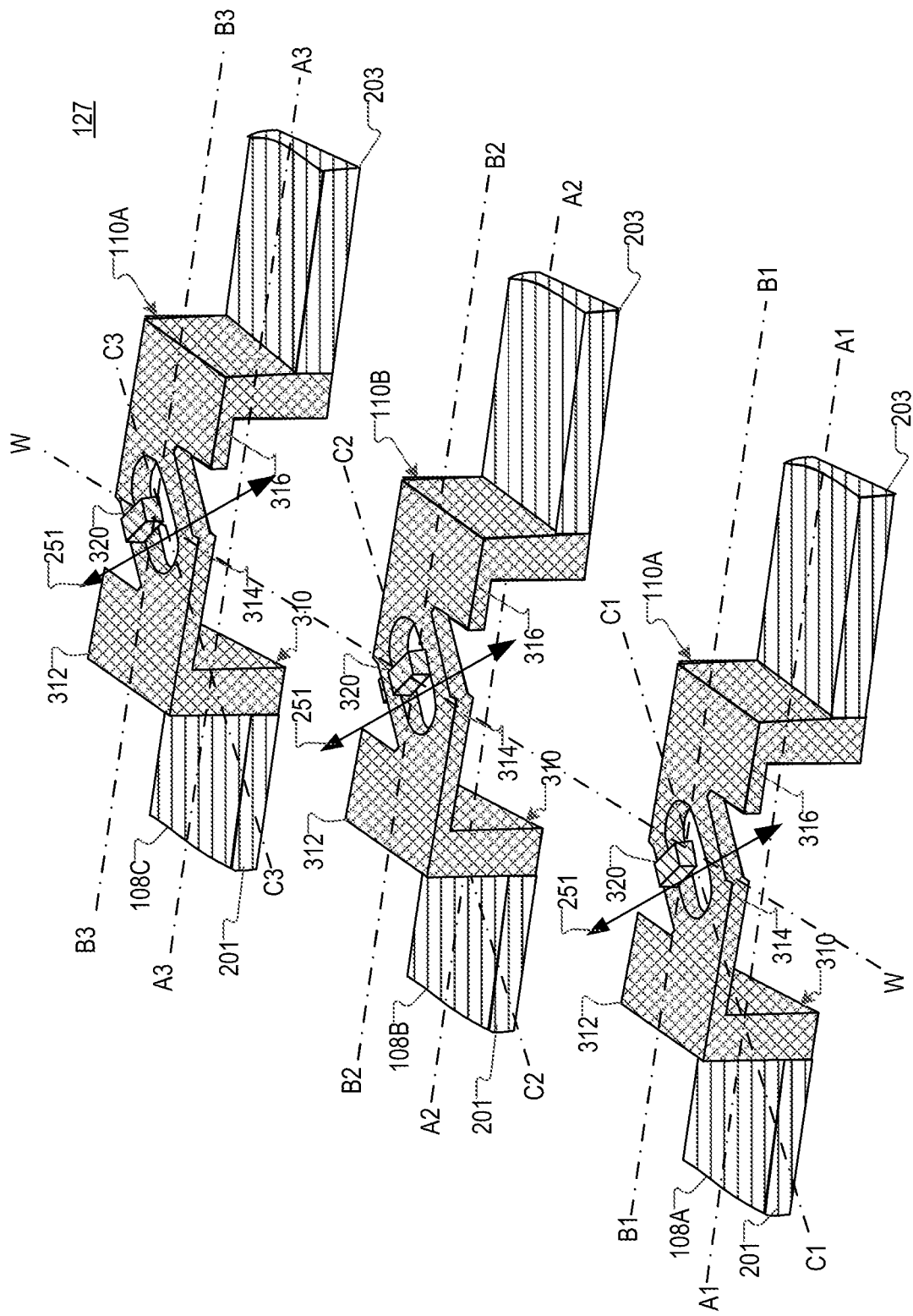
FIG. 2 is a diagram of a portion of the system of FIG. 1.

FIG. 2 is a diagram of an example of portion 127 (shown in FIG. 1) of the system 100, according to aspects of the disclosure. FIG. 2 illustrates that each of the sensor packages 110A-C may include a respective leadframe 310 and a respective current sensor 320. The respective current sensor 320 of each of the sensor packages 110A-C may be configured to measure the current through that sensor package's leadframe 310. Each leadframe 310 may include respective portions 312, 314, and 316. The current sensor 320 of each sensor package 110A-C may be disposed above portion 314 of this package's respective leadframe 310. The current sensor 320 of the sensor package 110A may sense the level of electrical current flow through portion 314 of the leadframe 310 of sensor package 110A. The current sensor 320 of the sensor package 110B may sense the level of electrical current flow through portion 314 of the leadframe 310 of sensor package 110B. The current sensor 320 of the sensor package 110C may sense the level of electrical current flow through portion 314 of the leadframe 310 of sensor package 110C.

FIG. 2 further illustrates that each of bus bars 108A-C may include respective portions 201 and 203, which are electrically isolated from one another. Furthermore, FIG. 2 illustrates that the respective portions 201 and 203 of each of the bus bars 108A-C may be bridged by a respective one of sensor packages 110A-C. Specifically, in the example of FIG. 2, the respective portions 201 and 203 of bus bar 108A are bridged by the leadframe 310 of sensor package 110A; the respective portions 201 and 203 of bus bar 108B are bridged by the leadframe 310 of sensor package 110B; and the respective portions 201 and 203 of bus bar 108C are bridged by the leadframe 310 of sensor package 110C. In some implementations, the leadframe 301 of the sensor package 110A may be soldered to portions 201 and 203 of the busbar 108A; the leadframe 301 of the sensor package 110B may be soldered to portions 201 and 203 of the busbar 108B; and the leadframe 301 of the sensor package 110C may be soldered to portions 201 and 203 of the busbar 108C.

According to the example of FIG. 2, bus bar 108A has a longitudinal axis A1-A1; bus bar 108B has a longitudinal axis A2-A2, and bus bar 108C has a longitudinal axis A3-A3. Furthermore, leadframe portions 312 and 316 of the sensor package 110A may have a longitudinal axis B1-B1, which is parallel to (or coincident with) the longitudinal axis A1-A1 of bus bar 108A. Leadframe portions 312 and 316 of the sensor package 110B may have a longitudinal axis B2-B2, which is parallel to (or coincident with) the longitudinal axis A2-A2 of bus bar 108B. Leadframe portions 312 and 316 of the sensor package 110C may have a longitudinal axis B3-B3, which is parallel to (or coincident with) the longitudinal axis A3-A3 of bus bar 108C. Portion 314 of the leadframe 310 of the sensor package 110A may have a longitudinal axis C1-C1 that is transverse to axes A1-A1 and B1-B. Portion 314 of the leadframe 310 of the sensor package 110B may have a longitudinal axis C2-C2 that is transverse to axes A2-A2 and B2-B2. Portion 314 of the leadframe 310 of the sensor package 110C may have a longitudinal axis C3-C3 that is transverse to axes A3-A3 and B3-B3.

The sensor packages 110A-C may be arranged along an axis W-W, which is perpendicular to axes A1-A1, A2-A2, and A3-A3. The current sensor 320 of each of the sensor packages 110A-C may be configured to use differential sensing to measure the electrical current through portion 314 of that sensor package's leadframe 310. Because portions 314 of the leadframes are: (i) arranged along the axis W-W, which is perpendicular to axes A1-A1, A2-A2, and A3-A3, and (ii) at an angle relative to axes A1-A1, A2-A2, and A3-A3, the magnetic field that is produced by each of portions 314 would project away from the current sensors 320 of neighboring sensor packages (in the direction indicated by arrows 251). As a result of this configuration, the amount of cross-talk between the sensor packages 110A-C may be reduced (or ideally eliminated).

In some implementations, the PCB 106 (shown in FIG. 1) may include multiple conductors. In this regard, portions 201 and 203 of each of the leadframes 310 may be bent to fit into the through-holes and connect with respective ones of the conductors. Alternatively, in some implementations, portions 201 and 203 of each of the lead frames 310 may be coupled to the conductors in the PCB 106 by using surface-mounting. Stated succinctly, the present disclosure is not limited to any specific configuration of portions 201 and 203 of the leadframes 310. Furthermore, it will be understood that the present disclosure is not limited to any specific method for connecting portions 201 and 203 of the leadframes 310 to the conductors that are part of a PCB.

Figure 3A:
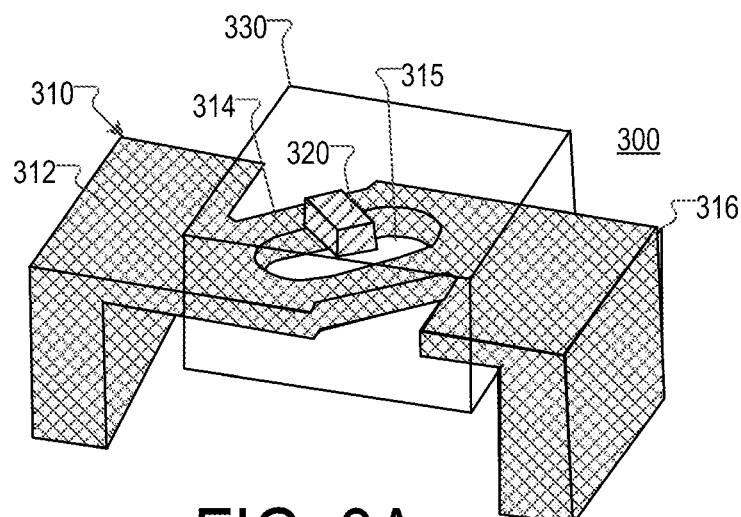
FIG. 3A is a schematic perspective view of a sensor package, according to aspects of the disclosure.
Figure 3B:
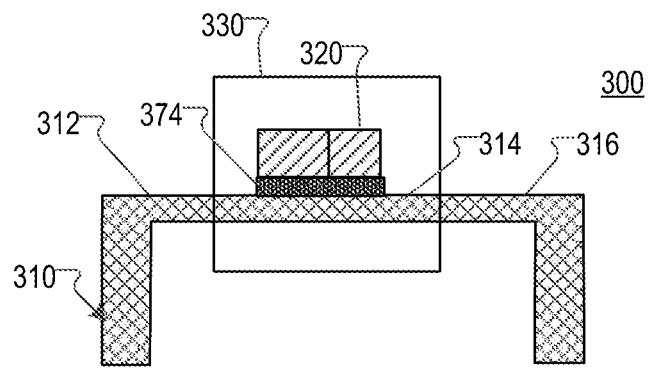
FIG. 3B is a planar side view of the sensor package of FIG. 3A, according to aspects of the disclosure.
Figure 3C:
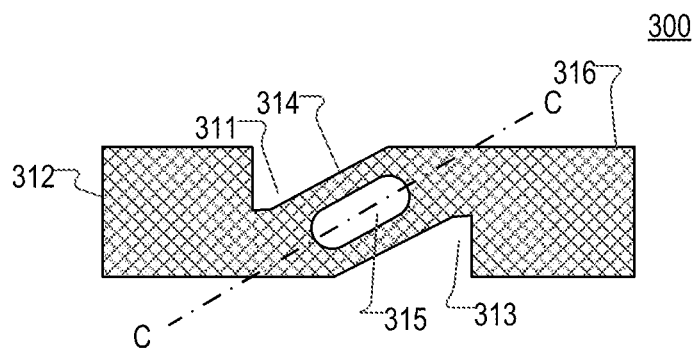
FIG. 3C is a planar top down view of the sensor package of FIG. 3A.

FIGS. 3A-C show an example of a sensor package 300. The sensor package 300 may be the same or similar to any of sensor packages 110A-B, which are discussed above with respect to FIGS. 1-2. As illustrated the sensor package 300 may include a leadframe 310 and a current sensor 320. The leadframe 310 may include portions 312, 314, and 316. As illustrated in FIG. 3C, portion 314 may have a longitudinal axis C-C. The current sensor 320 may be disposed above portion 314 of the leadframe 310, and it may be separated from the leadframe 310 by a layer of dielectric material 374. The current sensor 320 may be electrically isolated from the leadframe 310 and it may be arranged to measure the level of electrical current that is running through portion 314 of the leadframe 310. The current sensor 320 and portion 314 of the leadframe 310 may be encapsulated in dielectric material 330.

Figure 3D:
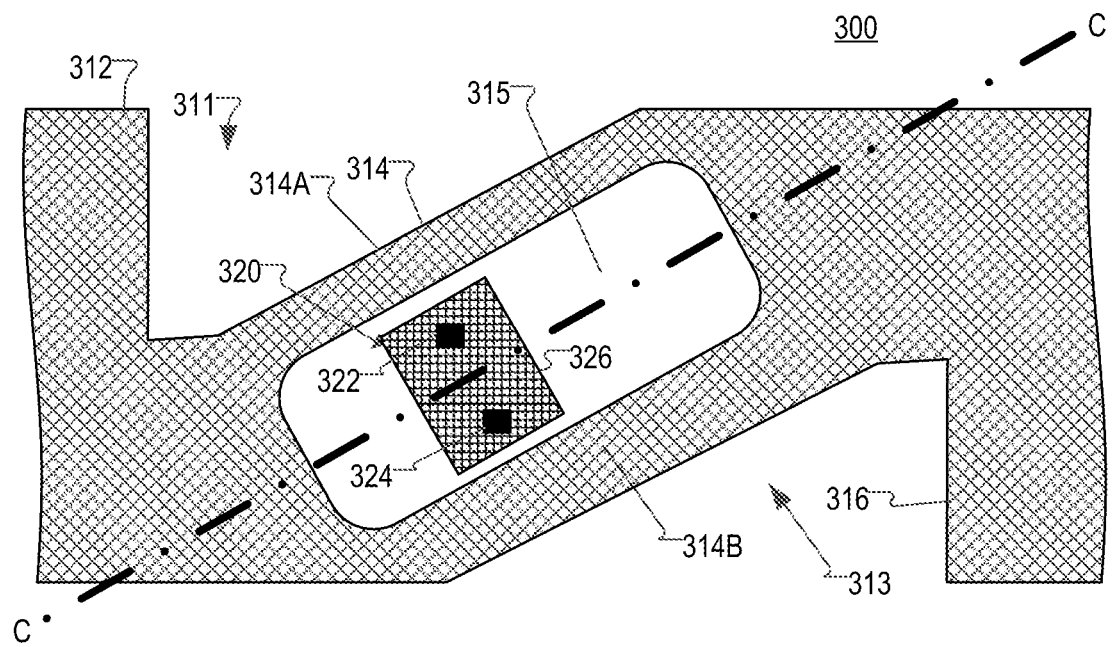
FIG. 3D is partial top-down view of the sensor package of FIG. 3A, according to aspects of the disclosure.

FIG. 3D shows portion 314 of the leadframe 310 and the current sensor 320 in further detail. As illustrated, portion 314 may have an aperture (e.g., through-hole) 315 formed therein. The current sensor 320 may be disposed above the aperture 315. The current sensor 320 may be a differential current sensor, and it may include magnetic field sensing elements 322 and 324 that are formed on a substrate 326. The magnetic field sensing elements 322 and 324 may be situated on opposite sides of the central longitudinal axis C-C of portion 314 of the leadframe 310?. According to the present example, each of the magnetic field sensing elements includes a planar Hall effect element. However, alternative implementations are possible in which another type of magnetic field sensing element is used such as a giant magnetoresistor (GMR) or a tunnel magnetoresistor (TMR). Furthermore, FIG. 3D illustrates that portion 314 of the leadframe 310 may be defined by notches 311 and 313 that are formed in the leadframe 310.

Figure 3E:
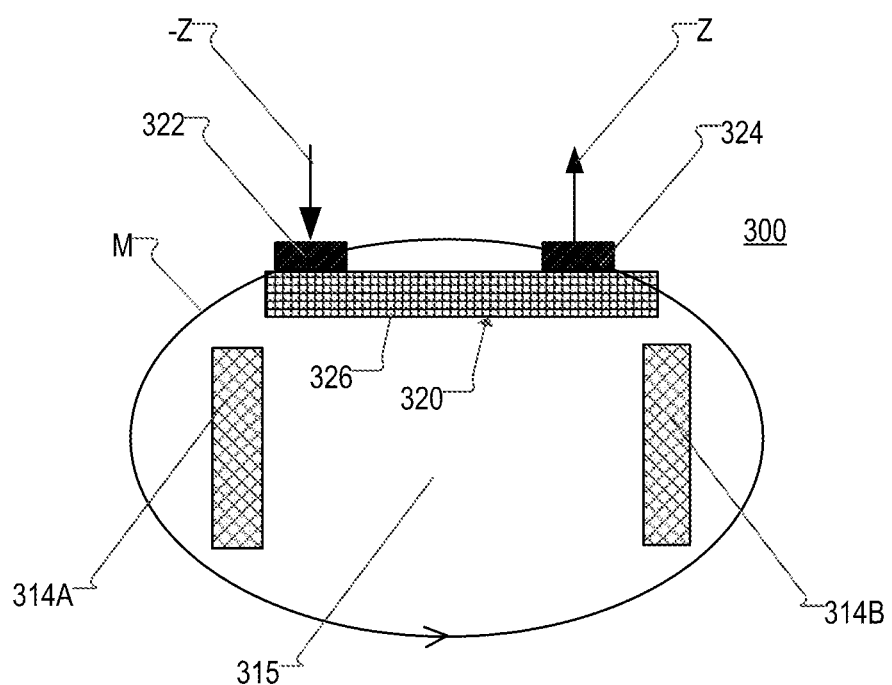
FIG. 3E is diagram illustrating an example of the operation of the sensor package of FIG. 3A, according to aspects of the disclosure.

FIG. 3E is a diagram illustrating aspects of the operation of the current sensor 320. As noted above, the current sensor 320 may be a differential current sensor. Portion 314 of the leadframe 310 may generate a magnetic field M when current flows through it. The magnetic field M may be equal to the sum of individual magnetic fields that are generated by the branches 314A and 314B of portion 314. Magnetic field sensing elements 322 and 324 may sense components of the magnetic field along the same axis (e.g., the Z-axis). However, the components of the magnetic field M that are sensed by magnetic field sensing elements 322 and 324 may have opposite signs due to the magnetic field M being co-axial with portion 314 of the leadframe 310. The output signal that is generated by the current sensor 320 (and which is indicative of the level of current through portion 314 of the leadframe 310) may be generated by subtracting the value sensed by the magnetic field sensing element 322 from the value sensed by the magnetic field sensing element 324. The subtraction may effectively cancel (or reduce the effects of) stray magnetic fields that are incident on the current sensor 320. The operation of the current sensor 320 is discussed in further detail with respect to FIG. 8.

Figure 3F:
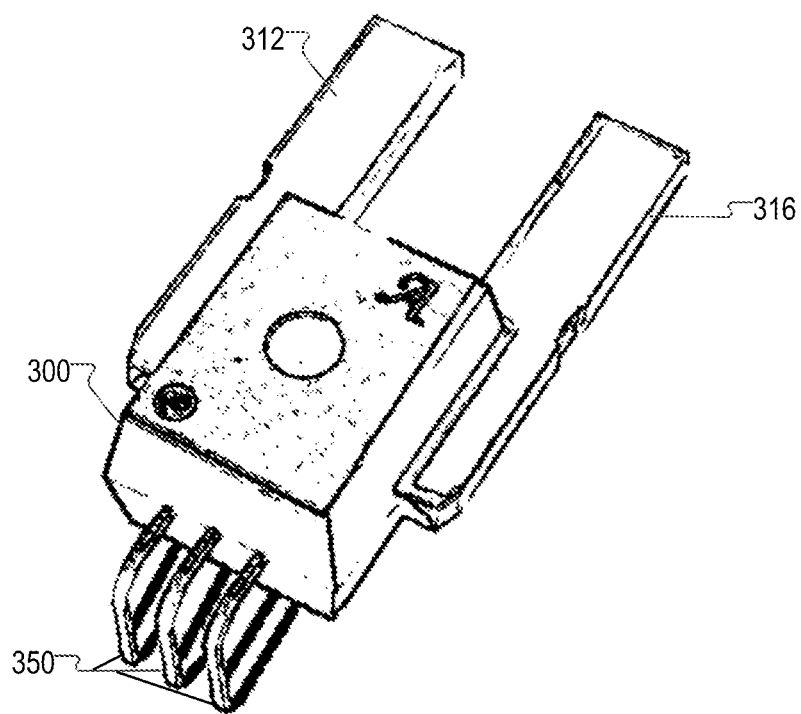
FIG. 3F is diagram illustrating an example of a packaging configuration of the sensor package of FIG. 3A, according to aspects of the disclosure.

FIG. 3F is a diagram of the sensor package 300 according to one example. As illustrated, portions 312 and 316 of the leadframe 310 may extend outside of the encapsulating material 330 and they more form leads for connecting the sensor package 300 to a bus bar. In addition, the current sensor 320 may include pins 350, which are connected to different components of the current sensor 320, and which are used to power and receive signals from the current sensor 320. In the example of FIG. 3F the sensor package 300 uses leadforms that are adapted for surface mounting. However, alternative implementations are possible in which the sensor package 300 uses leadforms that are adapted for through-hole mounting. Although in the example of FIG. 3F, portions 312 and 316 are flat, alternative implementations are possible in which they are bent to make them adapted for through hole mounting.

Figure 3G:
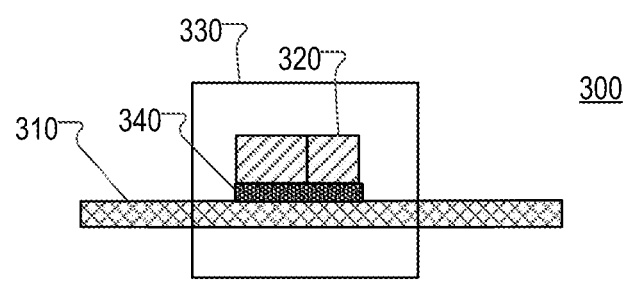
FIG. 3G is diagram illustrating an example of a packaging configuration of the sensor package of FIG. 3A, according to aspects of the disclosure.

FIG. 3G shows another possible implementation of the sensor package 300, according to aspects of the disclosure. In the example of FIG. 3G the sensor package 300 uses leadforms that are adapted for surface mounting. However, alternative implementations are possible in which the sensor package 300 uses leadforms that are adapted for through-hole mounting.

Figure 3H:
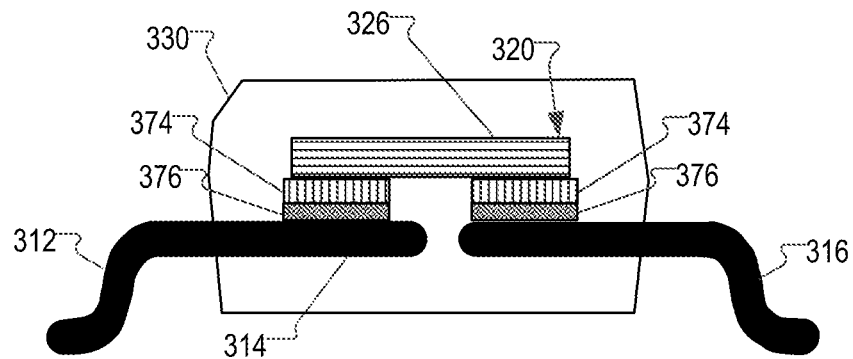
FIG. 3H is diagram illustrating an example of a packaging configuration of the sensor package of FIG. 3A, according to aspects of the disclosure.

FIG. 3H shows another possible implementation of the sensor package 300, according to aspects of the disclosure. In the example of FIG. 3H, a layer of dielectric material 374 may be disposed between the substrate 326 and portion 314 of the leadframe 310. The layer of dielectric material 374 may be coupled to portion 314 of the leadframe 310 with a layer of adhesive material 376. The layer of dielectric material 374 may include polyamide and/or any other suitable type of dielectric material. Although not shown in FIG. 3H, the package 300 may include leads for connecting the sensor die (i.e., the current sensor 320) to the conductive traces of a PCB. In the example of FIG. 3H, the sensor die may be arranged in a flip-chip configuration using solder bumps to connect it to the leads.

Figure 3I:
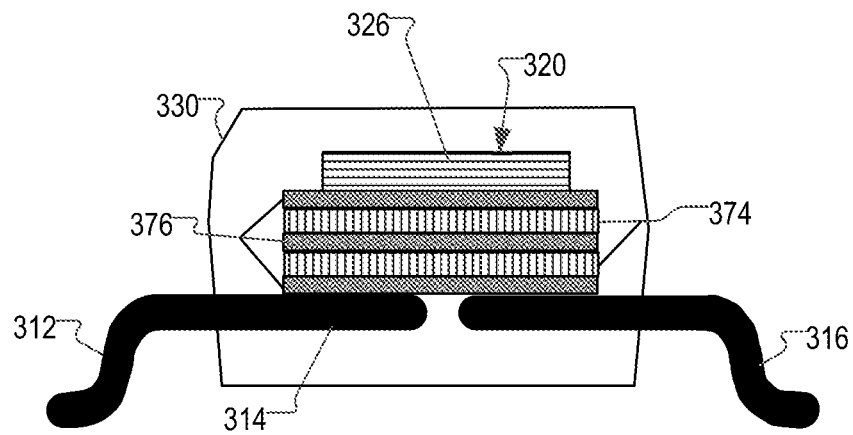
FIG. 3I is diagram illustrating an example of a packaging configuration of the sensor package of FIG. 3A, according to aspects of the disclosure.

FIG. 3I shows another possible implementation of the sensor package 300, according to aspects of the disclosure. In the example of FIG. 3I, the substrate 326 may be coupled to a first layer of dielectric material 374 by a first layer of adhesive material 376. Portions 314 of the leadframe 310 may be coupled to a second layer of dielectric material 374 by a second layer of adhesive material 376. And the first and second layers of dielectric material 374 may be coupled to one another by a third layer of adhesive material 376. Although not shown in FIG. 3I, the package 300 may include leads for connecting the sensor die (i.e., the current sensor 320) to the conductive traces of a PCB. In the example of FIG. 3H, the sensor die may be coupled to the leads via wire bonds.

Figure 3J:
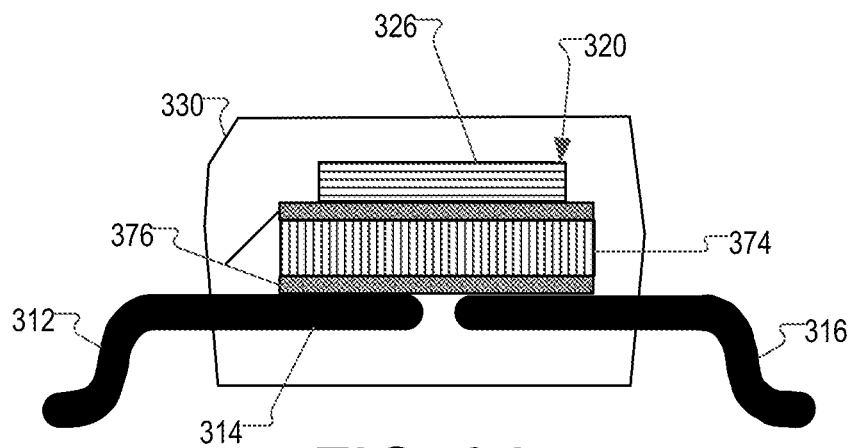
FIG. 3J is diagram illustrating an example of a packaging configuration of the sensor package of FIG. 3A, according to aspects of the disclosure.
Figure 4A:
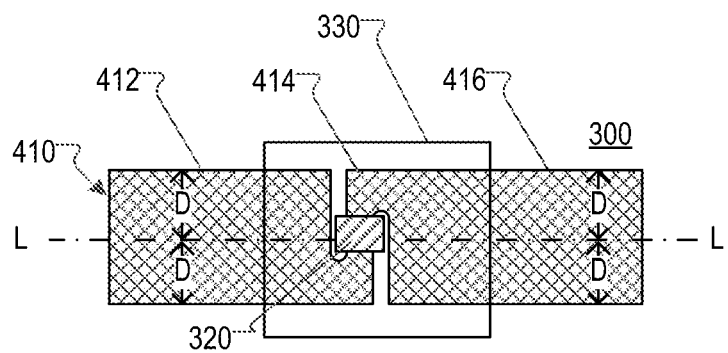
FIG. 4A is a schematic perspective view of a sensor package, according to aspects of the disclosure.
Figure 4B:
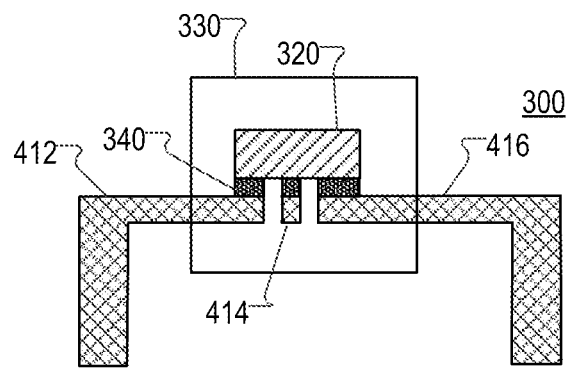
FIG. 4B is a cross-sectional side view of the sensor package of FIG. 4A, according to aspects of the disclosure.
Figure 4C:
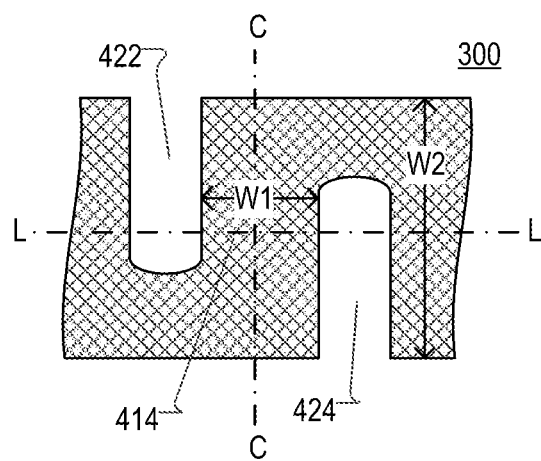
FIG. 4C is partial top-down view of the curent sensing element of FIG. 4A, according to aspects of the disclosure.
Figure 4D:
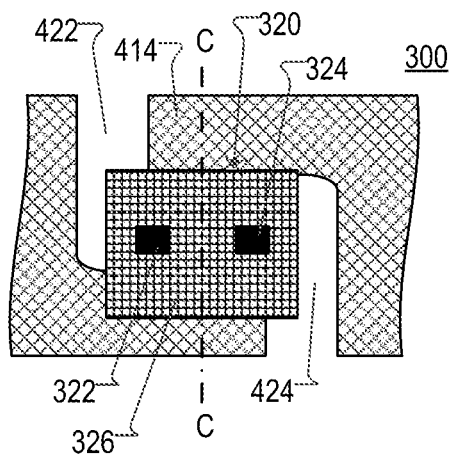
FIG. 4D is partial top-down view of the curent sensing element of FIG. 4A, according to aspects of the disclosure.

FIG. 3J shows another possible implementation of the sensor package 300, according to aspects of the disclosure. In the example of FIG. 3J, the substrate 326 may be coupled to a layer of dielectric material 374 by a first layer of adhesive material 376. Portion 314 of the leadframe 310 may be coupled to the layer of dielectric material 374 by a second layer of adhesive material 376. Although not shown in FIG. 3J, the package 300 may include leads for connecting the sensor die (i.e., the current sensor 320) to the conductive traces of a PCB. In the example of FIG. 3H, the sensor die may be coupled to the leads via wire bonds. In some respects, the packaging illustrated FIG. 3J may provide the highest degree of electrical insulation between the sensor die and the leadframe 310 and the packaging shown in FIG. 3H may provide the lowest degree of electrical insulation, while the packaging shown in FIG. 3I may be in-between in terms of electrical insulation. The leads of the sensor package 300, in any of the configurations shown in FIGS. 3H-3J may be adapted for through-hole mounting or surface-mounting, as necessary. Similarly, portions of 312 and 316 of the leadframe 310 in any of the configurations shown in FIGS. 3H-3J may be adapted for surface mounting. It will be understood that the present disclosure is not limited to using any specific type of packaging.

FIGS. 4A-D show an example of another implementation of the sensor package 300. The implementation of FIGS. 4A-D differs from the implementation of FIGS. 3A-D in that the sensor package 300 includes a different leadframe. More particularly, in the example of FIGS. 4A-D, the sensor package 300 is provided with a leadframe 410, which includes portions 412, 414, and 414. The leadframe 410 may have a central longitudinal axis L-L. The longitudinal axis L-L may run in the middle of the leadframe 410 and is separated by a distance D from each of the sides of the leadframe 410. Portion 414 is defined by notches 422 and 424 that are formed in the leadframe 410. Each of notches 422 and 424 extends beyond the longitudinal axis L-L as shown. Together, the notches 422 and 424 define the portion 414 of the leadframe 410. The portion 414 has a central axis C-C, which is perpendicular to longitudinal axis L-L. In general, current flows through portions 412 and 416 along axis L-L. However, the geometry of the leadframe 410 causes current to flow along axis C-C in portion 314. The width W1 of portion 414, in some implementations, may be smaller than the width W2 of portions 412 and 416. In some respects, causing portion 414 to have a smaller width than portions 412 and 416 is advantageous because it may reduce the extent to which skin effect affects the measurements taken by the current sensor 320. In some implementations, magnetic field sensing elements 322 and 324 may be situated on opposite sides of axis C-C and the current sensor 320 may be arranged to measure the level of current that is flowing through portion 414 of the leadframe 410.

Figure 5A:
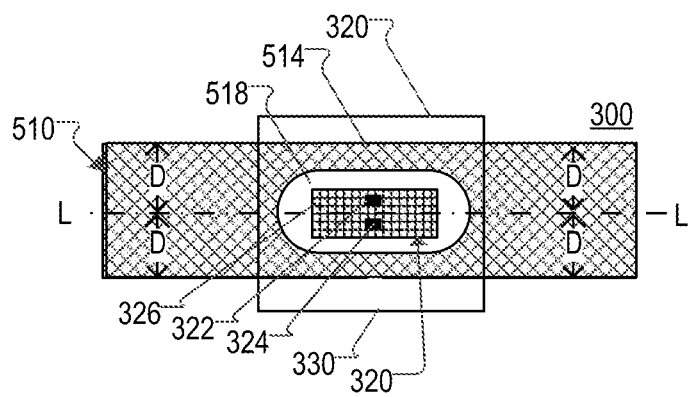
FIG. 5A is a schematic perspective view of a sensor package, according to aspects of the disclosure.
Figure 5B:
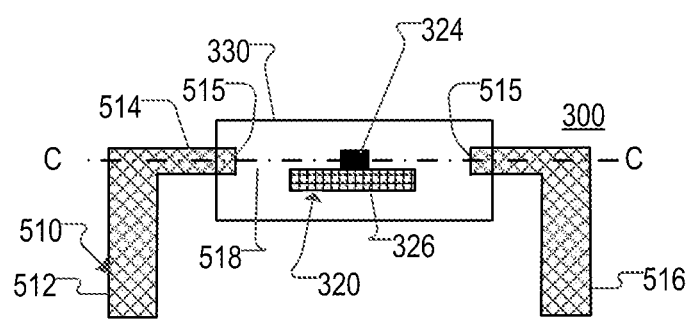
FIG. 5B is a cross-sectional side view of the sensor package of FIG. 5A, according to aspects of the disclosure.
Figure 5C:
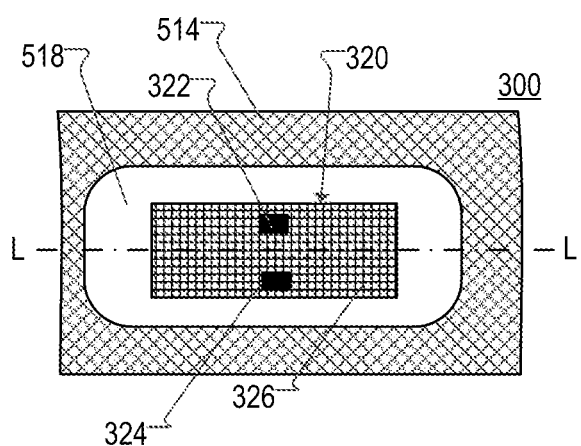
FIG. 5C is partial top-down view of the curent sensing element of FIG. 5A, according to aspects of the disclosure.

FIGS. 5A-C show an example of another implementation of the sensor package 300. The implementation of FIGS. 5A-C differs from the implementation of FIGS. 3A-J? in that the sensor package 300 includes a different leadframe, as well as in the positioning of the current sensor 320 relative to the leadframe. More particularly, in the example of FIGS. 5A-C, the sensor package 300 is provided with a leadframe 510, which includes portions 512, 514, and 516. An aperture 518 (e.g., through-hole) may be formed in portion 514 of the leadframe and the sensor 320 is at least partially inserted in the aperture 518, as shown. In some implementations, the magnetic field sensing elements 322 and 324 may be at least partially inserted in the aperture 518 and positioned in the same plane as the edge 515 of portion 514 of the leadframe 510. The leadframe 510 may have a central longitudinal axis L-L. The longitudinal axis L-L may run in the middle of the leadframe 510, and it may be separated by a distance D from each of the sides of the leadframe 510. The sensing elements 322 and 324 may be disposed on opposite sides of the axis L-L.

Figure 6A:
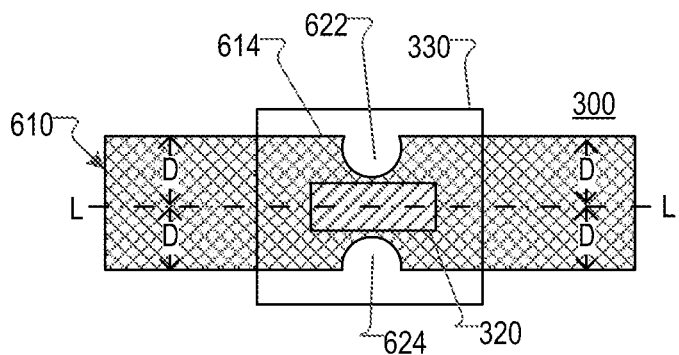
FIG. 6A is a schematic perspective view of a sensor package, according to aspects of the disclosure.
Figure 6B:
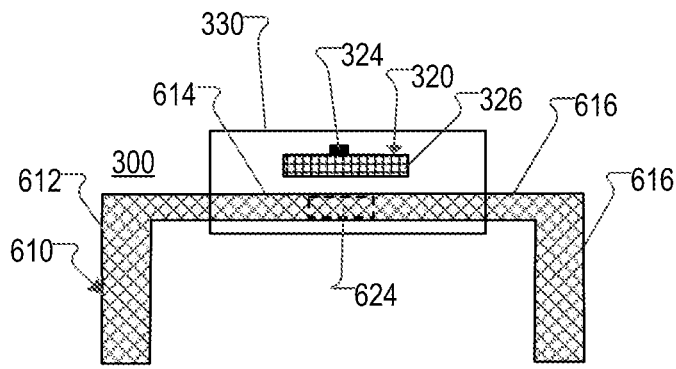
FIG. 6B is a cross-sectional side view of the sensor package of FIG. 6A, according to aspects of the disclosure.
Figure 6C:
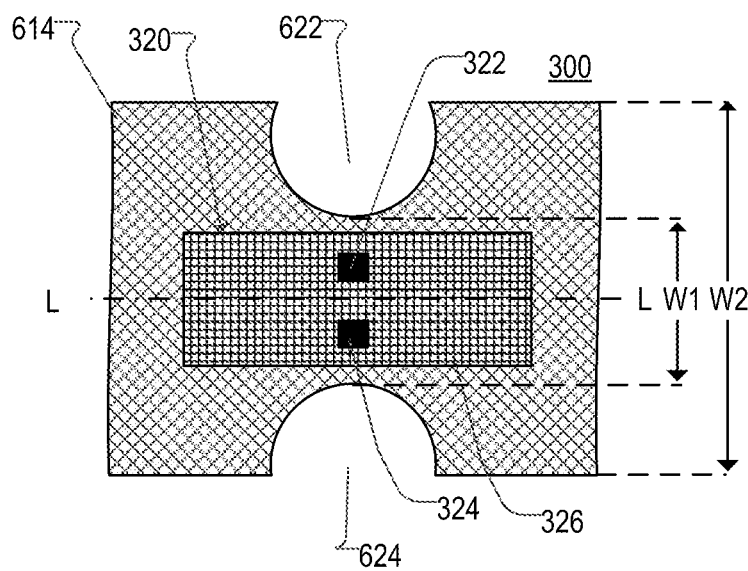
FIG. 6C is a partial top-down view of the curent sensing element of FIG. 6A, according to aspects of the disclosure.

FIGS. 6A-C show an example of another implementation of the sensor package 300. The implementation of FIGS. 6A-C differs from the implementation of FIGS. 3A-3D in that the sensor package 300 includes a different leadframe. More particularly, in the example of FIGS. 6A-C, the sensor package 300 is provided with a leadframe 610, which includes portions 612, 614, and 616. Notches 622 and 624 may be formed in portion 614 of the leadframe 610. In some implementations, notches 622 and 624 may have the same dimensions. However, alternative implementations are possible in which notch 622 has different size and/or shape from notch 624. Notches 622 and 624, may cause portion 614 of the leadframe 610 to have a width W1, which is smaller than the width W2 of the rest of the leadframe 610. The current sensor 320 may be disposed above portion 314, and between notches 622 and 624. The current sensor 320 may be configured to measure the level of current that is flowing through portion 614 (i.e., current that is flowing through the narrowed portion of leadframe 610). In some respects, notching the leadframe 610 to reduce its width, and placing the current sensor 320 over a portion of the leadframe 610 whose width has been reduced is advantageous because it can help minimize the impact of skin effect on the operation of the current sensor 320. The leadframe 610 may have a central longitudinal axis L-L. The longitudinal axis L-L may run in the middle of the leadframe 610, and it may be separated by a distance D from each of the sides of the leadframe 610. The sensing elements 322 and 324 may be disposed on opposite sides of the axis L-L, which may enable the sensor 320 to perform differential sensing of the current through portion 614.

Figure 6D:
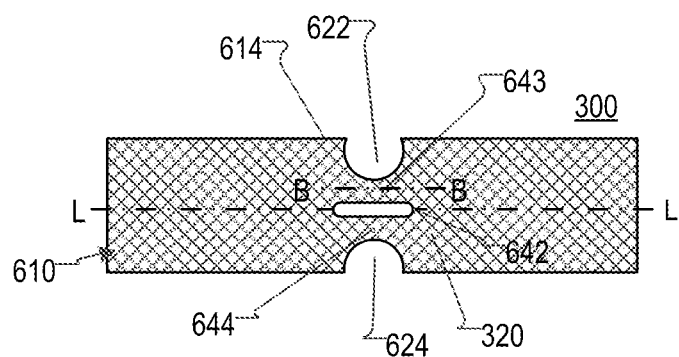
FIG. 6D is a schematic perspective view of a leadframe, according to aspects of the disclosure.
Figure 6E:
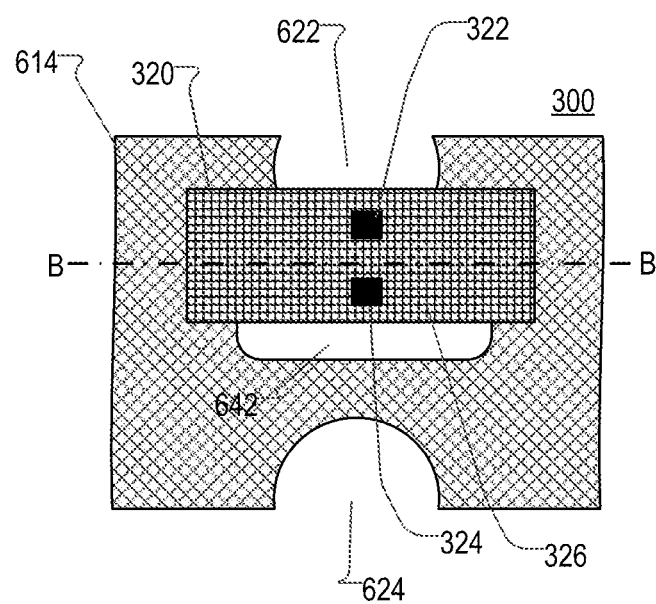
FIG. 6E is a partial top-down view of the sensor package of FIG. 6A, according to aspects of the disclosure.

FIG. 6D-E show an example of an alternative implementation of the leadframe 610. In the example of FIGS. 6D-E, the leadframe 610 is provided with an aperture (e.g., through-hole) 642, which divides the portion 614 into branches 643 and 644. The aperture 642 may be centered on the axis L-L or it may be offset from the axis L-L. Branch 643 may have a central axis B-B, which is parallel to axis L-L. Axis B-B may run in the middle of branch 643, and it may be equidistant from the edges of notch 622 and the aperture 642. The current sensor 320 may be placed over branch 643, as shown. The sensing elements 322 and 324 of the current sensor 320 may be formed on opposite sides of axis B-B to enable the sensor 320 to perform differential sensing of the current through branch 643.

Figure 7B:
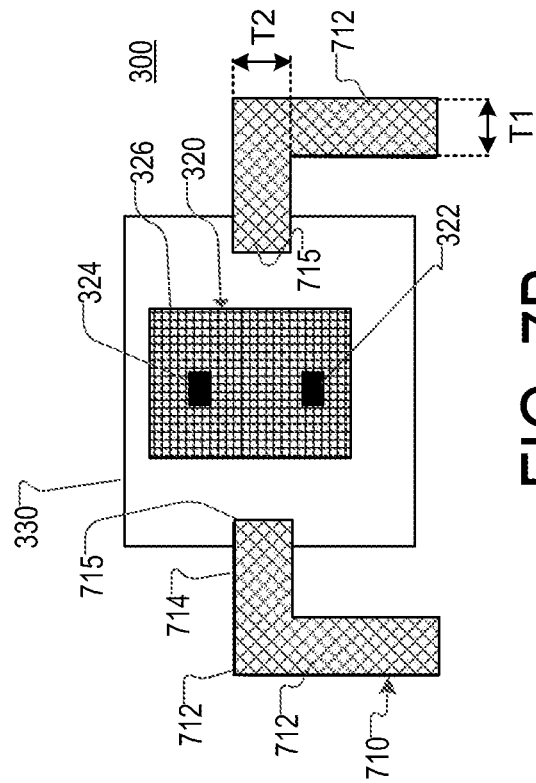
FIG. 7B is a cross-sectional side view of the sensor package of FIG. 6A, according to aspects of the disclosure.
Figure 7A:
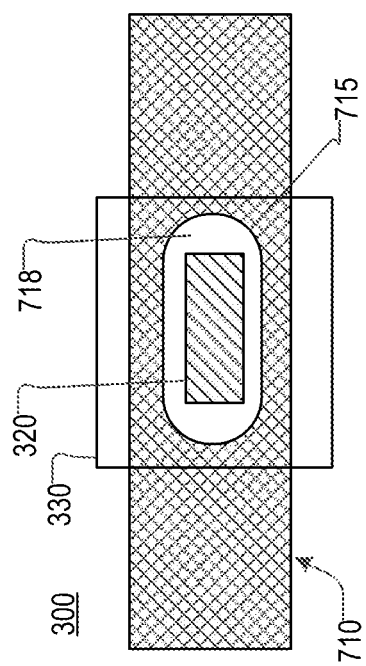
FIG. 7A is a schematic perspective view of a sensor package, according to aspects of the disclosure.

FIGS. 7A-B show an example of another implementation of the sensor package 300. The implementation of FIGS. 7A-B differs from the implementation of FIGS. 3A-D in that the sensor package 300 includes a different leadframe, as well as in the positioning of the current sensor 320 relative to the leadframe. More particularly, in the example of FIGS. 7A-B, the sensor package 300 is provided with a leadframe 710, which includes portions 712 and 714. An aperture 718 (e.g., through-hole) may be formed in portion 714 of the leadframe and the sensing element is inserted sideways in the aperture 718, as shown. As illustrated, the substrate 326 of the current sensor 320 may be arranged to face the edge 715 of the aperture 718, the sensing element 322 may be disposed below the portion 714 and the sensing element 324 may be disposed above the portion 714. In the example of FIGS. 7A-B, portion 712 may have a thickness T1 and portion 714 may have a thickness T2, which is the same as thickness T1. However, alternative implementations are possible in which portions 712 and 714 have different thicknesses.

The geometry of the leadframes 310, 410, 510, 610, and 710 may improve the performance of the current sensor 320 in each of the sensor packages 110A-C. The current sensor 320 in each of the sensor packages 110A-C may be configured to measure the central portion of that sensor package's leadframe. The central portion of the sensor package's leadframe may be one of portions 314, 414, 514, 614, and 714. In one respect, the central portion of each leadframe may have a smaller? cross-section than the rest of the leadframe (e.g., as a result of the placement of notches and an aperture in the leadframe). Having a smaller? cross-section is advantageous because it can reduce the amount of skin effect in the leadframe thus increasing the accuracy of the measurements taken by sensors 320 in any of the sensor packages 300-700. In the examples provided throughout the disclosure, each of the leadframes 310, 410, 510, 610, and 710 has a uniform thickness. However, alternative implementations are possible in which any of the leadframes 310, 410, 510, 610, and 710 has a non-uniform thickness, (e.g., with the middle portion being thicker or thinner than the side portions).

In another aspect, the central portion of the leadframe in each of sensor packages 300 may extend in a different direction than the rest of the leadframe. For example, portion 314 of the sensor package 300 may extend along axis C1-C1, while the rest of the leadframe of the sensor package 300 may extend along axis A1-A1 (e.g., see FIG. 2). As noted above, an advantage of this arrangement is that it may cause any magnetic field that is generated by portion 314 to be projected away from neighboring sensor packages (as indicated by arrows 251, which are shown in FIG. 2) thus reducing the amount of cross-talk in the system where the sensor package 300 is used. As another example, portion 414 of the sensor package 400 may extend along axis C-C, while the rest of the leadframe of the sensor package 400 may extend along axis L-L. An advantage of this arrangement is that it may cause any magnetic field that is generated by portion 414 to be projected away from neighboring sensor packages thus reducing the amount of cross-talk in the system where the sensor package 400 is used.

Figure 8:
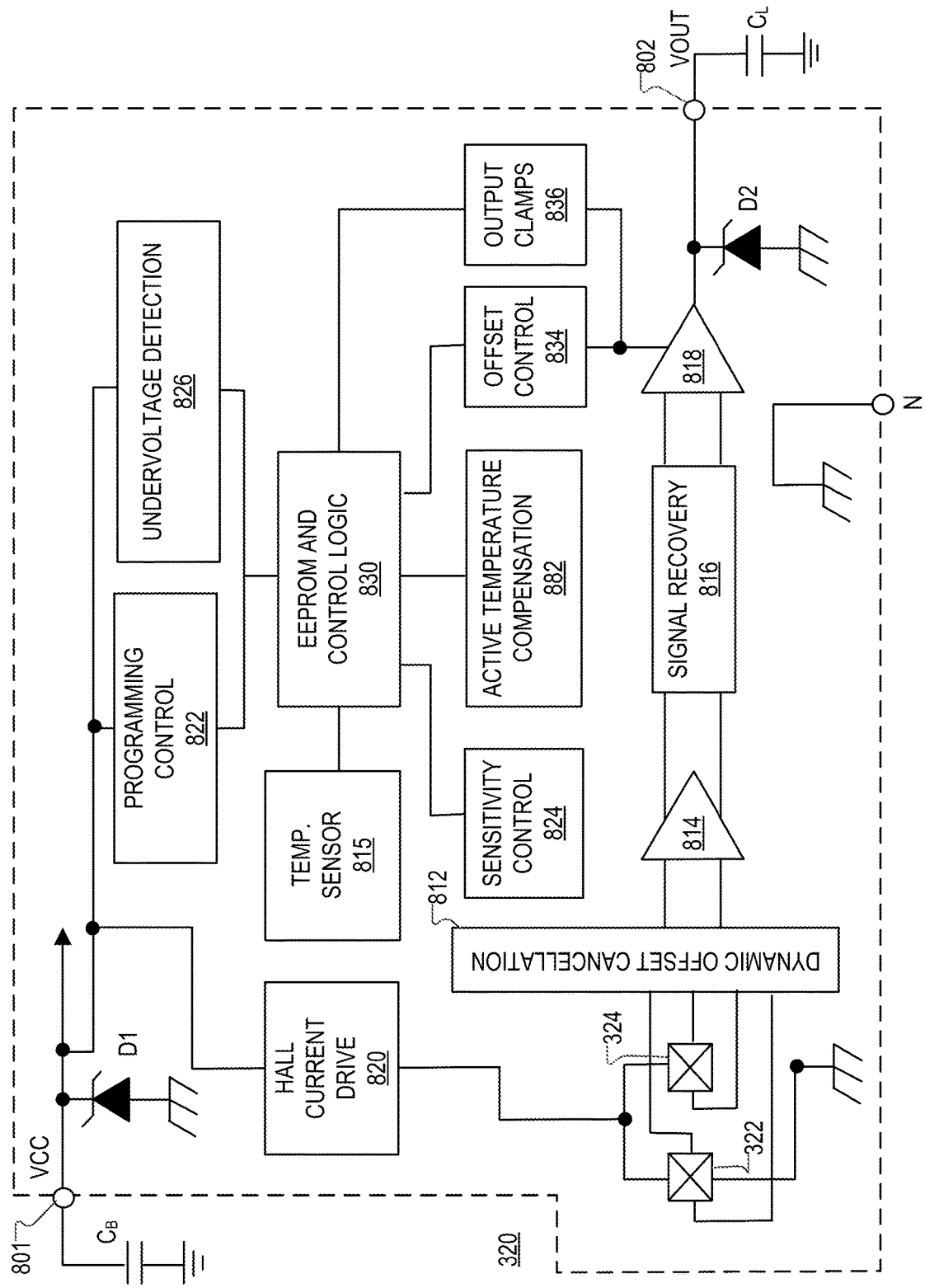
FIG. 8 is a diagram of an example of a current sensor, according to aspects of the disclosure.

FIG. 8 is a circuit diagram illustrating one possible implementation of the electronic circuitry of the current sensor 320.

The current sensor 320 may be configured to perform differential sensing. The current sensor 320 may be configured to output a signal VOUT that is proportional to AB=BR-BL where BR represents magnetic field incident on one of the sensing elements and BL represents magnetic field incident on the other one of the sensing elements. The sensor output VOUT is also affected by the sensitivity, a, of the signal path and can be represented as follows:

$$\text{VOUT} = a \times \Delta B \tag{1}$$

The relationship between the conductor current to be measured and the differential field AB can be represented by a coupling factor, CF as follows:

$$AB = CF \times I \tag{2}$$

It will be appreciated that coupling factor CF corresponds to coupling between a given current sensor and its proximate conductor and thus, corresponds to what is referred to herein as the intended coupling factor. With such differential sensing architecture, common mode stray fields are rejected.

The current sensor 320 may include a VCC (supply voltage) terminal 801, a VOUT (output signal) terminal 802. The VCC terminal 801 is used for the input power supply or supply voltage for the current sensor 320. A bypass capacitor, $C_B$, can be coupled between the VCC terminal 801 and ground. The VCC terminal 801 can also be used for programming the current sensor 320. The VOUT terminal 802 is used for providing the output signal VOUT to circuits and systems (not shown) such as controller 101 (FIG. 1) and can also be used for programming. An output load capacitance $C_L$ is coupled between the VOUT terminal 802 and ground. The current sensor 320 can include a first diode D1 coupled between the VCC terminal 801 and chassis ground and a second diode D2 coupled between the VOUT terminal 802 and chassis ground.

The driver circuit 820 may be configured to drive the magnetic field sensing elements 322-324. Magnetic field signals generated by the magnetic field sensing elements 322-324 are coupled to a dynamic offset cancellation circuit, which is further coupled to an amplifier 814. Magnetic field signals generated by the magnetic field sensing elements 322-324 are coupled to a dynamic offset cancellation circuit 812, which is further coupled to an amplifier 814. The amplifier 814 is configured to generate an amplified signal for coupling to the signal recovery circuit 816. Dynamic offset cancellation circuit 812 may take various forms including chopping circuitry and may function in conjunction with offset control 834 to remove offset that can be associated with the magnetic field sensing elements 322-324 and/or the amplifier 814. For example, offset cancellation circuit 812 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the current sensor 320 to regulate the supply voltage.

A programming control circuit 822 and an undervoltage detection circuit 826 are coupled between the VCC terminal 801 and EEPROM and control logic circuit 830 to provide appropriate control to the EEPROM and control logic circuit. EEPROM and control logic circuit 830 determines any application-specific coding and can be erased and reprogrammed using a pulsed voltage. A sensitivity control circuit 824 can be coupled to the amplifier 814 to generate and provide a sensitivity control signal to the amplifier 814 to adjust a sensitivity and/or operating voltage of the amplifier 814. An active temperature compensation circuit 882 can be coupled to sensitivity control circuit 824, EEPROM and control logic circuit 830, and offset control circuit 834. The offset control circuit 834 can generate and provide an offset signal to a push/pull driver circuit 818 (which may be an amplifier) to adjust the sensitivity and/or operating voltage of the driver circuit 818. The active temperature compensation circuit 882 can acquire temperature data from EEPROM and control logic circuit 830 via a temperature sensor 815 and perform necessary calculations to compensate for changes in temperature, if needed. Output clamps circuit 836 can be coupled between the EEPROM and control logic circuit 830 and the driver 818 to limit the output voltage and for diagnostic purposes.

In some implementations, the leadframe of the current sensor 320 may be configured to carry current in the range of 200-400A. In some implementations, as noted above, the sensor package 300 may be mounted on a PCB by using through-hole mounting or surface mounting. Additionally or alternatively in some implementations, the current sensor 320 may be configured to include an application circuit. In some implementations, the current sensor 320 may be packaged by using transfer molding, injection molding, and/or any other similar sensing technology. In some implementations, the current sensor 320 may be configured to perform differential sensing and/or any other suitable type of sensing. In this regard it will be understood that the current sensor 320 may implement any suitable type of architecture that is used in current sensors, and the present disclosure is not limited to any specific implementation of the current sensor 320. In some implementations, the current sensor 320 may utilize gain compensation techniques to suppress the effects of eddy currents in bus bars 108A-C. An example of gain compensation techniques that can be used as described in U.S. Pat. No. 11,047,928, entitled "METHODS AND APPARATUS FOR FREQUENCY EFFECT COMPENSA- TION IN MAGNETIC FIELD CURENT SENSORS, which is herein incorporated by reference in its entirety. In some implementations, because of the geometry of leadframes 310, 410, 510, 610, and 710, no customer trimming may be required for signals that are generated by the current sensor 320 and/or the sensor package 300.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. An apparatus, comprising:
a leadframe configured to carry a current to be sensed;
a current sensor that is electrically isolated from the leadframe, the current sensor being disposed adjacent to a first portion of the leadframe, the first portion including a plurality of notches that are formed therein, the current sensor including a substrate, a first magnetic field sensing element that is formed on the substrate, and a second magnetic field sensing element that is formed on the substrate, the first magnetic field sensing element and the second magnetic field sensing element being disposed on opposite sides of a central axis of the first portion of the leadframe and configured to sense the current; and
an encapsulating material that is configured to encapsulate the current sensor and at least a part of the first portion of the leadframe that is adjacent to the current sensor and includes the plurality of notches,
wherein the first portion of the leadframe is disposed between a second portion of the leadframe and a third portion of the leadframe, the first portion of the leadframe is formed in a same plane as the second portion of the leadframe and the third portion of the leadframe, and the first portion extends at an angle relative to the second portion and the third portion.

2. The apparatus of claim 1, wherein the current sensor includes a coreless current sensor.

3. The apparatus of claim 1, wherein the first magnetic field sensing element includes a first Hall effect element and the second magnetic field sensing element includes a second Hall effect element.

4. The apparatus of claim 1, wherein the current sensor is separated from the first portion of the leadframe by a layer of insulating material.

5. The apparatus of claim 1, wherein the substrate is disposed above or below the plurality of notches.

6. The apparatus of claim 1, wherein the first portion of the leadframe includes a through-hole, and the current sensor is disposed above or below the through-hole.

7. The apparatus of claim 1, wherein:
the plurality of notches includes a first notch and a second notch that are formed on opposite sides of a central axis of the first portion of the leadframe, and
the current sensor is disposed above or below the first portion.

8. The apparatus of claim 1, wherein the first portion of the leadframe includes a through-hole and the current sensor is inserted in the through-hole.

9. The apparatus of claim 1, wherein:
the plurality of notches includes a first notch and a second notch that are formed on opposite sides of the first portion of the leadframe and extend beyond the central axis of the first portion of the leadframe, and
the current sensor is disposed above or below the first portion.

10. The apparatus of claim 1, wherein the first portion of the leadframe includes a through-hole that is formed therein.

11. An apparatus, comprising:
a leadframe having a first portion, a second portion, and a third portion, the first portion of the leadframe being contiguous with respect to the second portion of the leadframe and the third portion of the leadframe, the first portion of the leadframe being disposed between the second portion of the leadframe and the third portion of the leadframe and configured to carry a current between the second portion and the third portion, the first potion, the second potion, and the third portion of the leadframe being defined by a first notch and a second notch that are formed on opposite sides of the leadframe, the first notch and the second notch being so shaped as to cause the first portion in the leadframe to extend at an angle relative to the second portion of the leadframe and the third portion of the leadframe;
a current sensor that is electrically isolated from the leadframe, the current sensor being disposed above or below the first portion of the leadframe; and
an encapsulating material that is configured to encapsulate the current sensor and at least a part of the first portion of the leadframe that is situated directly above or below the current sensor.

12. The apparatus of claim 11, wherein the current sensor includes a differential current sensor having a substrate, a first magnetic field sensing element that is formed on the substrate, and a second magnetic field sensing element that is formed on the substrate, the first magnetic field sensing element and the second magnetic field sensing element being disposed on opposite sides of a central axis of the first portion of the leadframe.

13. The apparatus of claim 11, wherein:
the first notch and the second notch cause the first portion to have a smaller width than at least one of the first portion and the second potion, and the current sensor is disposed above or below the first portion.

14. An apparatus, comprising:
a leadframe having a first portion, a second portion, and a third portion, the first portion of the leadframe being disposed between the second portion of the leadframe and the third portion of the leadframe, the first portion including a through-hole that is formed therein;
a current sensor that is electrically isolated from the leadframe; and
an encapsulating material that is configured to encapsulate the current sensor and at least a part of the first portion of the leadframe that includes the through-hole,
wherein the leadframe includes a first notch and a second notch that are formed on opposite sides of the leadframe, and
wherein the first notch and the second notch are so shaped as to cause the first portion to extend at an angle relative to the second portion and the third portion of the leadframe.

15. The apparatus of claim 14, wherein the current sensor includes a differential current sensor having a substrate, a first magnetic field sensing element that is formed on the substrate, and a second magnetic field sensing element that is formed on the substrate, the first magnetic field sensing element and the second magnetic field sensing element being disposed on opposite sides of a central axis of the leadframe.

16. The apparatus of claim 14, wherein the current sensor is disposed above or below the first portion.

17. The apparatus of claim 14, wherein the current sensor is disposed in the through-hole.

18. The apparatus of claim 14, wherein the first notch and the second notch are further arranged to cause the first portion to have a smaller width than at least one of the first portion and the second portion, and the current sensor is disposed above or below the first portion.

19. A method, comprising:
providing a leadframe having a first portion, a second portion, and a third portion, the first portion of the leadframe being contiguous with respect to the second portion of the leadframe and the third portion of the leadframe, the first portion of the leadframe being disposed between the second portion of the leadframe and the third portion of the leadframe and configured to carry a current between the second portion and the third portion, the first portion of the leadframe being disposed at a non-zero angle relative to at least one of the second portion of the leadframe and the third portion of the leadframe, the first port of the leadframe being formed in a same plane as the second portion of the leadframe and the third portion of the leadframe;
providing a current sensor that is electrically isolated from the leadframe, the current sensor being disposed above or below the first portion of the leadframe; and
encapsulating the current sensor and at least a part of the first portion of the leadframe that is situated directly above or below the current sensor in encapsulating material.

20. The method of claim 19, wherein the first portion of the leadframe includes a notch.

21. The method of claim 19, wherein the first portion of the leadframe includes a through-hole.

22. The method of claim 19, wherein the first portion of the leadframe is defined by a plurality of notches that are formed in the leadframe.

23. The method of claim 19, wherein the current sensor includes a differential current sensor having a substrate, a first magnetic field sensing element that is formed on the substrate, and a second magnetic field sensing element that is formed on the substrate, the first magnetic field sensing element and the second magnetic field sensing element being disposed on opposite sides of a central axis of the first portion of the leadframe.

* * * * *